(12) United States Patent
Yang et al.

(10) Patent No.: US 11,997,801 B2
(45) Date of Patent: May 28, 2024

(54) PRINTED CIRCUIT BOARD

(71) Applicant: SAMSUNG ELECTRO-MECHANICS CO., LTD., Suwon-si (KR)

(72) Inventors: Woo Seok Yang, Suwon-si (KR); Jae Han Park, Suwon-si (KR); Jung Hyun Cho, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/741,388

(22) Filed: May 10, 2022

(65) Prior Publication Data

US 2023/0189452 A1      Jun. 15, 2023

(30) Foreign Application Priority Data

Dec. 15, 2021   (KR) .................. 10-2021-0179530

(51) Int. Cl.
　　*H05K 3/46*　　　(2006.01)
　　*H05K 1/11*　　　(2006.01)
　　*H05K 1/18*　　　(2006.01)

(52) U.S. Cl.
　　CPC .......... *H05K 3/4697* (2013.01); *H05K 1/115* (2013.01); *H05K 1/185* (2013.01); *H05K 3/4602* (2013.01); *H05K 2201/0209* (2013.01); *H05K 2201/09136* (2013.01)

(58) Field of Classification Search
　　CPC ............... H05K 1/185; H05K 2201/09136
　　See application file for complete search history.

(56) References Cited

U.S. PATENT DOCUMENTS

| 10,939,556 | B1 | 3/2021 | Sim et al. | |
|---|---|---|---|---|
| 2007/0080360 | A1* | 4/2007 | Mirsky | H01L 23/3735 257/706 |
| 2015/0014034 | A1 | 1/2015 | Hwang et al. | |
| 2015/0221830 | A1* | 8/2015 | Kim | H01L 33/62 257/98 |
| 2019/0164895 | A1* | 5/2019 | Kim | H01L 23/552 |

FOREIGN PATENT DOCUMENTS

| KR | 20110080599 | A | * | 7/2011 | ......... H01L 23/5389 |
|---|---|---|---|---|---|
| KR | 20110080599 | A | * | 7/2011 | ......... H01L 23/5389 |
| KR | 10-2015-0008771 | A | | 1/2015 | |
| KR | 10-2021-0076586 | A | | 6/2021 | |

OTHER PUBLICATIONS

KR 20110080599 A Translation (Year: 2023).*

* cited by examiner

*Primary Examiner* — Timothy J Thompson
*Assistant Examiner* — John B Freal
(74) *Attorney, Agent, or Firm* — MORGAN, LEWIS & BOCKIUS LLP

(57) ABSTRACT

A printed circuit board includes: a core portion including a cavity in one surface thereof; first and second penetration holes disposed in a bottom surface of the cavity and penetrating through the core portion; an electronic component disposed in the cavity; and an insulating material filling the cavity and each of the first and second penetration holes, wherein a sidewall of the cavity is higher than the electronic component.

20 Claims, 5 Drawing Sheets

PRINTED CIRCUIT BOARD

CROSS-REFERENCE TO RELATED APPLICATION(S)

This application claims benefit of priority to Korean Patent Application No. 10-2021-0179530 filed on Dec. 15, 2021 in the Korean Intellectual Property Office, the disclosure of which is incorporated herein by reference in its entirety.

TECHNICAL FIELD

The present disclosure relates to a printed circuit board.

BACKGROUND

In order to follow the recent trend of mobile devices towards weight and size reductions, there has been a growing need for making printed circuit boards mounted thereon lighter, thinner, shorter, and smaller.

Meanwhile, to meet technical requirements according to mobile devices that have become lighter, thinner, shorter, and smaller, there has been a need for a technology for inserting electronic components such as ICs, active devices, or passive devices into a board to shorten a connection path between the electronic components and reduce noise. Accordingly, research into technology for embedding a component in a board has recently been undertaken in various manners.

In particular, a board is formed to have a cavity therein to insert various components into the board, and a technique using a blasting process or the like is performed to form a cavity.

SUMMARY

An aspect of the present disclosure may provide a printed circuit board including a fine circuit and/or a fine via.

Another aspect of the present disclosure may provide a printed circuit board having an electronic component mounted in a cavity thereof.

According to an aspect of the present disclosure, a printed circuit board may include: a core portion including a cavity in one surface thereof; first and second penetration holes disposed in a bottom surface of the cavity and penetrating through the core portion; an electronic component disposed in the cavity; and an insulating material filling the cavity and each of the first and second penetration holes, wherein a sidewall of the cavity is higher than the electronic component.

According to an aspect of the present disclosure, a printed circuit board may include: a core portion including a cavity; at least one penetration hole connected to a bottom surface of the cavity and at least partially penetrating through the core portion; an electronic component disposed in the cavity; and an insulating material filling the cavity and the at least one penetration hole, wherein a depth of the cavity is larger than a thickness of the electronic component, and a central axis of the at least one penetration hole is offset from a center of the cavity.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Electronic Device

Figure 1:
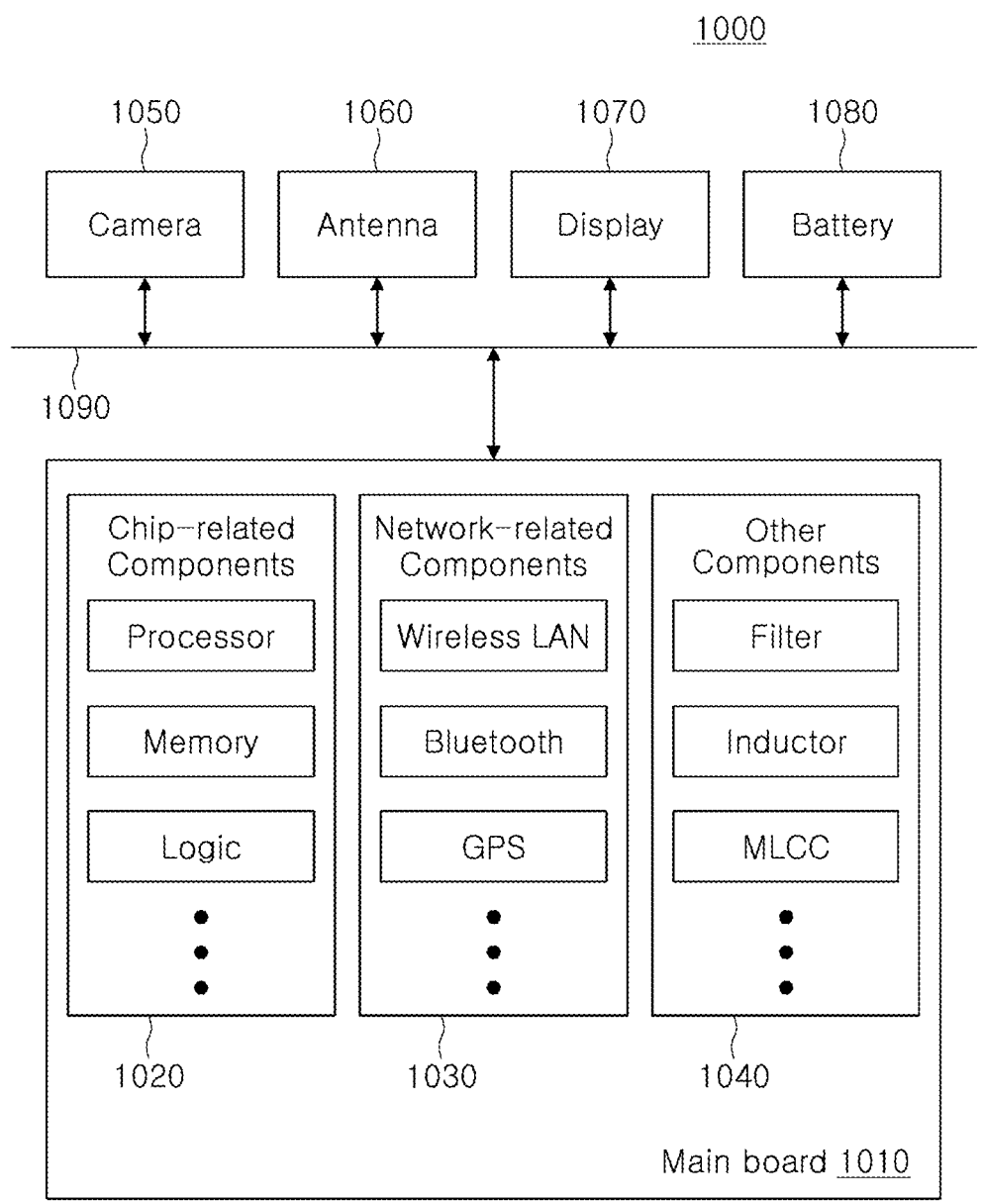
FIG. 1 is a schematic view illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip-related components 1020, network-related components 1030, and other components 1040, which are physically and/or electrically connected thereto. These components may be connected to other electronic components to be described below to form various signal lines 1090.

The chip-related components 1020 may include a memory chip such as a volatile memory (e.g., a dynamic random access memory (DRAM)), a non-volatile memory (e.g., a read only memory (ROM)), or a flash memory; an application processor chip such as a central processor (e.g., a central processing unit (CPU)), a graphics processor (e.g., a graphics processing unit (GPU)), a digital signal processor, a cryptographic processor, a microprocessor, or a microcontroller; and a logic chip such as an analog-digital converter or an application-specific integrated circuit (ASIC). The chip-related components 1020 are not limited thereto, but may also include other types of chip-related electronic components. In addition, these electronic components 1020 may be combined with each other. The chip-related components 1020 may be in the form of a package including the chips or electronic components described above.

The network-related components 1030 may include protocols such as wireless fidelity (Wi-Fi) (Institute of Electrical and Electronics Engineers (IEEE) 802.11 family or the like), worldwide interoperability for microwave access (WiMAX) (IEEE 802.16 family or the like), IEEE 802.20, long term evolution (LTE), evolution data only (Ev-DO), high speed packet access+(HSPA+), high speed downlink packet access+ (HSDPA+), high speed uplink packet access+ (HSUPA+), global system for mobile communications (GSM), enhanced data GSM environment (EDGE), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, but may also include a variety of other wireless or wired standards or protocols. In addition, the network-related components 1030 may be combined with each other, together with the chip-related electronic components 1020.

The other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components 1040 are not limited thereto, but also include passive elements in chip component type used for various other purposes, and the like. In addition, the other components 1040 may be combined with each other, together with the chip-related electronic components 1020 and/or the network-related electronic components 1030.

Depending on the type of electronic device 1000, the electronic device 1000 may include other electronic components that may or may not be physically and/or electrically connected to the mainboard 1010. Examples of the other electronic components may include a camera 1050, an antenna 1060, a display 1070, a battery 1080, and the like. The other electronic components are not limited thereto, but may be an audio codec, a video codec, a power amplifier, a compass, an accelerometer, a gyroscope, a speaker, a mass storage unit (e.g., a hard disk drive), a compact disk (CD), a digital versatile disk (DVD), and the like. The other electronic components may also include other electronic components and the like used for various purposes depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
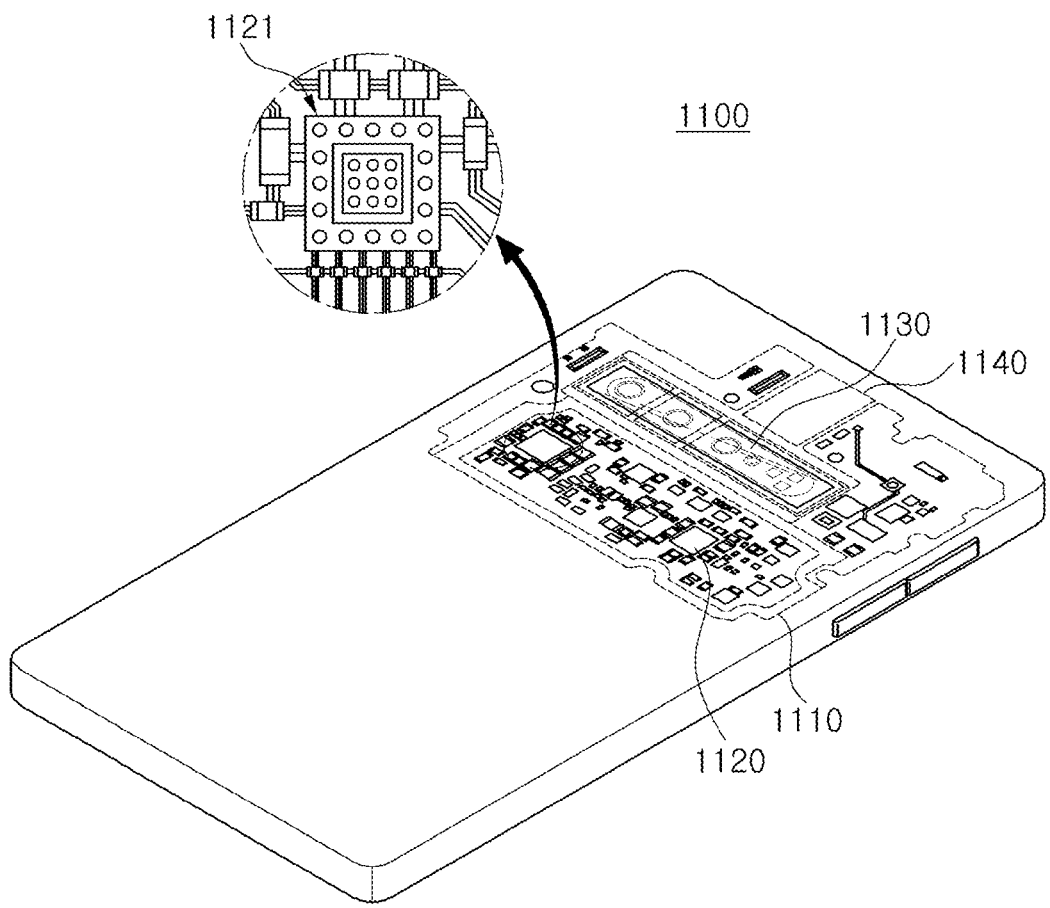
FIG. 2 is a schematic view illustrating an exemplary embodiment of an electronic device.

FIG. 2 is a schematic perspective view illustrating an exemplary embodiment of an electronic device.

Referring to FIG. 2, the electronic device may be, for example, a smartphone 1100. A mainboard 1110 may be accommodated in the smartphone 1100, and various electronic components 1120 may be physically and/or electrically connected to the mainboard 1110. In addition, other electronic components that may or may not be physically and/or electrically connected to the mainboard 1110, such as a camera module 1130 and/or a speaker 1140, may also be accommodated therein. Some of the electronic components 1120 may be the above-described chip-related components, e.g., an antenna module 1121, but are not limited thereto. The antenna module 1121 may be in such a form that the electronic component is surface-mounted on a printed circuit board, but is not limited thereto. Meanwhile, the electronic device is not necessarily limited to the smartphone 1100, but may be any other electronic device as described above.

Printed Circuit Board

Figure 3:
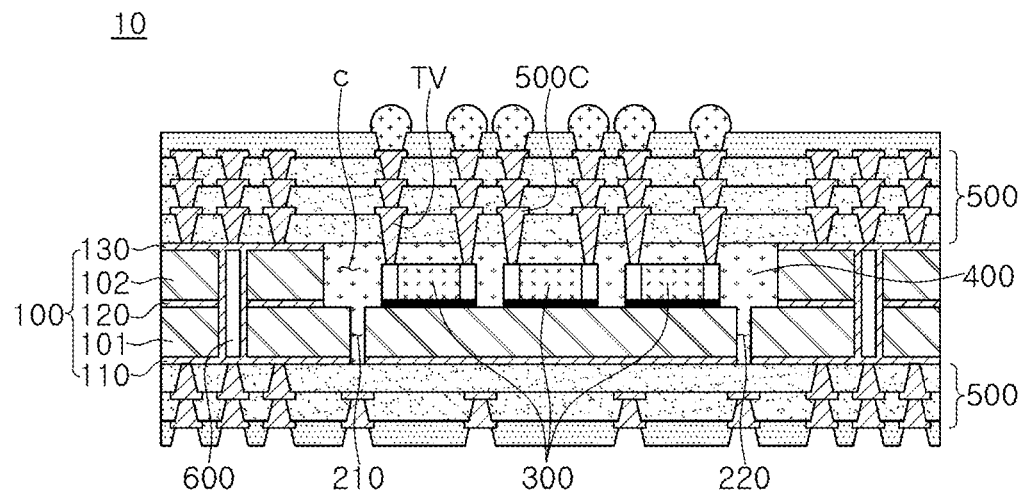
FIG. 3 is a schematic view illustrating an exemplary embodiment of a printed circuit board according to the present disclosure.

FIG. 3 is a schematic view illustrating an exemplary embodiment of a printed circuit board 10 according to the present disclosure.

Referring to FIG. 3, the printed circuit board 10 according to the present disclosure may include a core portion 100 including a cavity C in one surface thereof, first and second penetration holes 210 and 220 disposed on a bottom surface of the cavity C and penetrating through the core portion 100, an electronic component 300 disposed in the cavity C, and an insulating material 400 filling the cavity C and each of the first and second penetration holes 210 and 220. In particular, in this case, a sidewall of the cavity C may be higher than the electronic component 300. That is, the cavity C, in which the electronic component 300 is disposed, may be formed to be thicker than the electronic component 300, so that the insulating material 400 filling the cavity C covers an upper surface and each of both side surfaces of the electronic component 300.

In this case, the core portion 100 may have a thickness of 1.2 mm or more. By configuring the core portion 100 to have the electronic component 300 embedded therein, it is possible to manufacture a printed circuit board with improved P/I characteristics and enhanced warpage characteristics.

In addition, the first and second penetration holes 210 and 220 disposed on the bottom surface of the cavity C and penetrating through the core portion 100 may refer to penetration holes penetrating through the cavity C, which penetrates through a portion of the core portion 100, and the core portion 100 remaining under the bottom surface of the cavity C, as illustrated in FIG. 3. In this case, the first and second penetration holes 210 and 220 may be formed by a known method. A central axis of at least one of the penetration holes 210 and 220 may be offset from a center of the cavity. The central axis may be along a stacking direction of the circuit board, and may be nearer to a sidewall of the cavity than to the center of the cavity.

More specifically, the core portion 100 may include a first insulating layer 101, first and second metal layers 110 and 120 disposed on both surfaces of the first insulating layer 101 respectively, a second insulating layer 102 disposed on one surface of the second metal layer 120, and a third metal layer 130 disposed on one surface of the second insulating layer. That is, the core portion 100 may include five layers by sequentially arranging three metal layers 110, 120, and 130 and two insulating layers 101 and 102, but is not limited thereto.

In this case, the cavity C may be formed to at least partially penetrate through the second and third metal layers 120 and 130 and the second insulating layer 102, and the first and second penetration holes 210 and 220 may be disposed to penetrate through the first insulating layer 101 and the first metal layer 110 with a diameter of 25 to 250 µm.

The first and second penetration holes 210 and 220 may be filled with the insulating material 400, and in particular, the insulating material 400 filling the first and second penetration holes 210 and 220 may be integrally formed with the insulating material 400 filling the cavity C of the core portion 100, but is not limited thereto. That is, the insulating material 400 may be integrally formed in the cavity C of the core portion 100 and the first and second penetration holes 210 and 220.

Also, although it is illustrated in FIG. 3 that only the first and second penetration holes 210 and 220 are disposed on the bottom surface of the cavity C, three or more penetration holes may be disposed on the bottom surface of the cavity C, so that some of the insulating material 400 filling the cavity C flows thereinto, when the printed circuit board 10 is viewed in a top or bottom view thereof. That is, three or more penetration holes may be disposed on the bottom surface of the cavity C, and the insulating material 400 may be disposed in each of the three or more penetration holes, but is not limited thereto.

In the printed circuit board 10 according to the present disclosure, at least one build-up layer 500 may be disposed on each of both surfaces of the core portion 100. In this case, the build-up layer 500 may include at least one build-up insulating layer and at least one circuit layer 500C.

In this case, the circuit layer 500C and the electronic component 300 may be connected to each other through a through via TV. That is, the through via TV may connect the circuit layer 500C and the electronic component 300 to each other, and penetrate through at least a portion of each of the build-up insulating layer and the insulating material 400 filling the cavity C, but is not limited thereto.

In addition, the build-up layer 500 may include at least one via connecting an upper circuit layer and a lower circuit layer to each other, and the via of the build-up layer 500 may have a smaller depth than the through via TV penetrating through a portion of the insulating material 400, but is not limited thereto.

In the printed circuit board 10 according to the present disclosure, the core portion 100 may have a thickness of 1.2 mm or more. While thicknesses of the first and second insulating layers 101 and 102 and the first to third metal layers 110 to 130 of the core portion 100 are not particularly defined, the thickness of the core portion 100 including all of the five layers may be 1.2 mm or more, but is not limited thereto.

In this case, the sidewall of the cavity C may be higher than the electronic component 300. That is, the cavity C, in which the electronic component 300 is disposed, may be formed to be thicker than the electronic component 300, so that the insulating material 400 filling the cavity C covers an upper surface and each of both side surfaces of the electronic component 300.

In this case, the core portion 100 may have a thickness of 1.2 mm or more. By configuring the core portion 100 to have the electronic component 300 embedded therein, it is possible to manufacture a printed circuit board with improved P/I characteristics and enhanced warpage characteristics.

In addition, the printed circuit board 10 according to the present disclosure may further include a through hole 600 penetrating through the core portion 100. The through hole 600 may be formed by a known method. More specifically, the through hole 600 may be formed by a laser drilling method or a CNC drilling method, and may be filled with a conductive material and a polymer, but is not limited thereto.

A solder resist layer may be further disposed on an outermost circuit layer of the build-up layer 500 in the printed circuit board 10 according to the present disclosure. In this case, the outermost circuit layer may include a connection pad, and a solder connected to the connection pad may be further disposed to connect the connection pad to an external electronic component or a semiconductor substrate.

The first and second insulating layers 101 and 102 of the core portion 100 in the printed circuit board 10 according to the present disclosure may include a known insulating material, but are not limited thereto. More specifically, the first and second insulating layers 101 and 102 may be formed by using at least one of a thermosetting resin such as an epoxy resin, a thermoplastic resin such as a polyimide resin, and a resin in which the thermosetting or thermoplastic resin is impregnated together with an inorganic filler in a core material such as a glass fiber (glass cloth or glass fabric), for example, prepreg, Ajinomoto build-up film (ABF), FR-4, or bismaleimide triazine (BT).

In addition, at least one build-up insulating layer disposed in the build-up layer 500 may also include a known insulating material. That is, the build-up insulating layer may also be formed by using at least one of a thermosetting resin such as an epoxy resin, a thermoplastic resin such as a polyimide resin, and a resin in which the thermosetting or thermoplastic resin is impregnated together with an inorganic filler in a core material such as a glass fiber (glass cloth or glass fabric), for example, prepreg, Ajinomoto build-up film (ABF), FR-4, or bismaleimide triazine (BT).

In addition, the insulating material 400 filling the cavity C of the core portion 100 and the first and second penetration holes 210 and 220 may include a resin or a polymer, but is not limited thereto. The insulating material 400 may include a known insulating material as long as it is applicable in an inkjet filling scheme, for example, filling the holes and cavity with printhead moving sideways.

In addition, each of the circuit layer 500C, the through via TV, and the via of the build-up layer 500 may be formed using a conductive material such as copper (Cu), aluminum (Al), silver (Ag), tin (Sn), gold (Au), nickel (Ni), lead (Pb), titanium (Ti), palladium (Pd), or an alloy thereof, but is not limited thereto. In this case, the through via TV may connect the circuit layer 500C of the build-up layer 500 and the electronic component 300 to each other, and the via may be a via penetrating through at least a portion of the build-up insulating layer of the build-up layer 500, but the through via TV and the via are not limited thereto.

In addition, each of the circuit layer 500C, the through via TV, and the via of the printed circuit board 10 according to the present disclosure may include an electroless plating layer and an electrolytic plating layer. The electroless plating layer may serve as a seed layer for the electrolytic plating layer, but is not limited thereto. In particular, when a conductive material disposed on an inner wall of the through hole 600 is formed by plating, the through hole 600 may include an electroless plating layer and an electrolytic plating layer, but is not limited thereto.

In this case, the electroless plating layer and the electrolytic plating layer filling each of the circuit layer and the via may also include copper (Cu), aluminum (Al), silver (Ag), tin (Sn), gold (Au), nickel (Ni), lead (Pb), titanium (Ti), palladium (Pd), or an alloy thereof.

The printed circuit board 10 according to the present disclosure may include a surface treatment layer on at least a portion of a circuit layer formed on one surface of the outermost insulating layer, and the surface treatment layer may include a different composition from each of the circuit layers. For example, each of the circuit layers may include copper (Cu), and the surface treatment layer may include nickel (Ni) or tin (Sn), but the circuit layer and the surface treatment layer are not limited thereto.

In addition, the printed circuit board 10 according to the present disclosure may further include a solder resist layer disposed to cover at least a portion of the outermost circuit layer including the surface treatment layer. In this case, the solder resist layer may be formed of a photosensitive material. In addition, the solder resist may have thermosetting and/or photocurable properties, but is not limited thereto.

Method for Manufacturing Printed Circuit Board

FIGS. 4 to 11 are schematic views illustrating an exemplary embodiment of a method for manufacturing a printed circuit board 10 according to the present disclosure.

Figure 4:
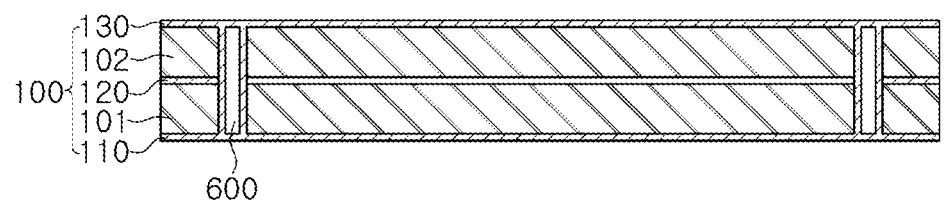
FIGS. 4 to 11 are schematic views illustrating an exemplary embodiment of a method for manufacturing a printed circuit board according to the present disclosure.

First, as illustrated in FIG. 4, a core portion 100 in which a through hole 600 is formed may be prepared. In this case, the through hole 600 may be formed by a known method. More specifically, the through hole 600 may be formed by forming a hole through a laser drilling process or a CNC drilling process, plating an inner wall of the hole with an electroless plating layer and an electrolytic plating layer, and then filling the hole with a polymer, but is not limited thereto.

In addition, the core portion 100 may include three metal layers and two insulating layers. More specifically, a first insulating layer 101 with first and second metal layers 110 and 120 disposed on both surfaces thereof, respectively, may be prepared, and a second insulating layer 102 on which a third metal layer 130 is disposed may be stacked on one surface of the second metal layer 120. In this case, the first insulating layer 101 may be a copper clad laminate (CCL) including copper foils on both surfaces thereof, but is not limited thereto.

In addition, the core portion 100 may have a thickness of 1.2 mm or more. That is, when thicknesses of the first and second insulating layers 101 and 102 and the first to third metal layers 110 to 130 are added up, a total thickness may be 1.2 mm, but is not limited thereto.

In this case, a method of measuring the thickness of the core portion 100 will be described below and may be performed using, for example, a scanning electron microscope, and an optical microscope.

After selecting an arbitrary point of the core portion 100, a thickness of the selected point may be measured multiple times. In this case, the above-described thickness of the core portion 100 may be an arithmetic mean value of the thicknesses measured multiple times, but is not limited thereto.

Alternatively, after selecting a plurality of arbitrary points of the core portion 100, respective thicknesses of the plurality of selected points may be measured. In this case, the above-described thickness of the core portion 100 may be an arithmetic mean value of the measured respective thicknesses of the plurality of selected points, but is not limited thereto.

Figure 5:
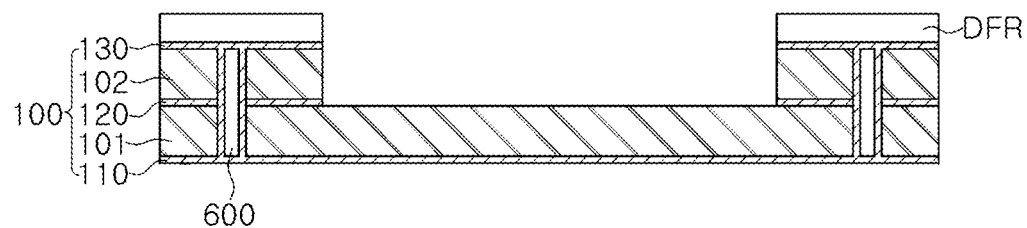

Thereafter, a cavity C may be formed in the core portion 100 as illustrated in FIG. 5. In this case, a method of forming the cavity C may be a known method. More specifically, the cavity C may be formed by a laser drilling method, a CNC drill method, or a blasting method after disposing a photosensitive material (DFR) or the like that functions as a mask on one surface of the core portion 100, but is not limited thereto.

In this case, the cavity C of the core portion 100 may penetrate through the second insulating layer 102, and may penetrate through at least a portion of the second metal layer 120 between the first and second insulating layers, but is not limited thereto. In addition, the cavity C may penetrate through a portion of the first insulating layer 101, so that at least a portion of the first insulating layer 101 is exposed to a bottom surface of the cavity, but is not limited thereto.

In particular, the cavity C of the core portion 100 may be formed to have a larger thickness or height than an electronic component 300, which will be described below. In this way, the electronic component 300 may be completely embedded in the cavity C, but is not limited thereto.

In this case, the core portion 100 may have a thickness of 1.2 mm or more. By configuring the core portion 100 to have the electronic component 300 embedded therein, it is possible to manufacture a printed circuit board with improved P/I characteristics and enhanced warpage characteristics.

The first and second insulating layers 101 and 102 of the core portion 100 may include a known insulating material. For example, the applicable known insulating material may be at least one of a thermosetting resin such as an epoxy resin, a thermoplastic resin such as a polyimide resin, and a resin in which the thermosetting or thermoplastic resin is impregnated together with an inorganic filler in a core material such as a glass fiber (glass cloth or glass fabric), e.g., prepreg, Ajinomoto build-up film (ABF), FR-4, or bismaleimide triazine (BT).

The first to third metal layers 110 to 130 of the core portion 100 may be formed using a conductive material such as copper (Cu), aluminum (Al), silver (Ag), tin (Sn), gold (Au), nickel (Ni), lead (Pb), titanium (Ti), palladium (Pd), or an alloy thereof, but are not limited thereto. In this case, the through via TV may connect the circuit layer 500C of the build-up layer 500 and the electronic component 300 to each other, and the via may be a via penetrating through at least a portion of the build-up insulating layer of the build-up layer 500, but the through via TV and the via are not limited thereto.

Figure 6:
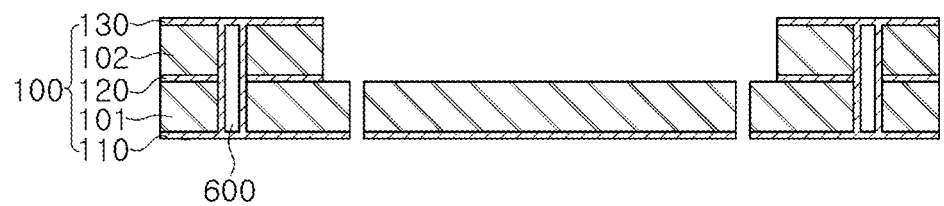

Thereafter, as illustrated in FIG. 6, the photosensitive material (DFR) or the like functioning as a mask may be removed, and at least a portion of the first insulating layer 101 may be exposed to the bottom surface of the cavity C. Thereafter, at least one penetration hole penetrating through the first insulating layer 101 may be formed on the bottom surface of the cavity C. More specifically, first and second penetration holes 210 and 220 penetrating through the first insulating layer 101 and the first metal layer 110 may be formed on the bottom surface of the cavity C. In this case, the first and second penetration holes 210 and 220 may be components for entirely filling the cavity C with an insulating material 400, which will be described below. In this case, at least some of the insulating material 400 may flow into each of the first and second penetration holes 210 and 220, but the insulating material 400 is not limited thereto.

In this case, the first and second penetration holes 210 and 220 may have a diameter or a cross-sectional area of less than a predetermined value. In addition, the first and second penetration holes 210 and 220 may be formed by a known method. More specifically, the first and second penetration holes 210 and 220 may be formed through laser drilling or CNC drilling, but are not limited thereto.

Figure 7:
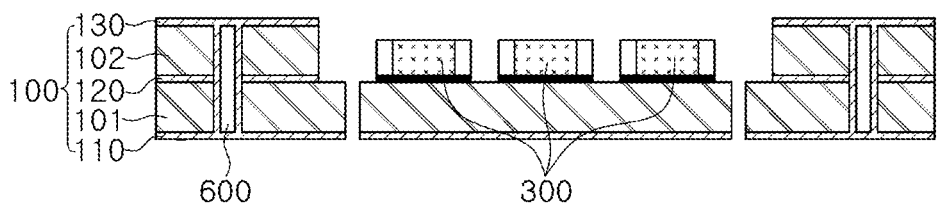

Thereafter, as illustrated in FIG. 7, the electronic component 300 may be disposed on the bottom surface of the cavity C. In this case, the electronic component 300 may be disposed on one surface of the first insulating layer 101 using a known adhesive. For example, the electronic component 300 may be attached to one surface of the first insulating layer 101 using a die attach film (DAF), but is not limited thereto.

Figure 8:
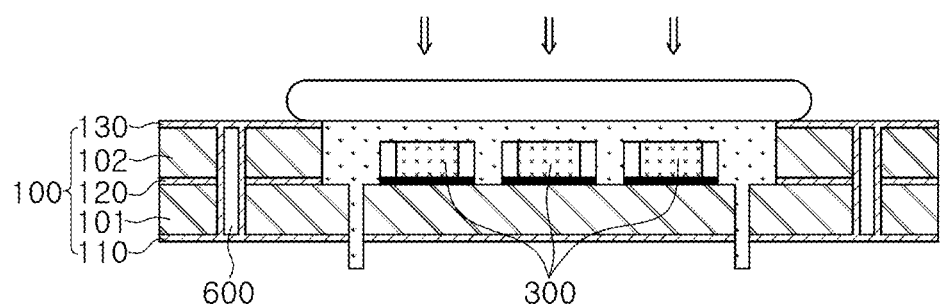

Thereafter, as illustrated in FIG. 8, the insulating material 400 filling the cavity C of the core portion 100 may be disposed. In this case, the insulating material 400 may be filled in an inkjet type. In this way, at least some of the insulating material 400 may flow into the first and second penetration holes 210 and 220 described above, but the insulating material 400 is not limited thereto.

That is, each of the cavity C of the core portion 100 and the first and second penetration holes 210 and 220 may be filled with the insulating material 400, and in this case, the insulating material 400 filling the cavity C and the first and second penetration holes 210 and 220 may be integrally formed, but is not limited thereto.

In this case, the insulating material 400 filling the cavity C of the core portion 100 and the first and second penetration holes 210 and 220 may include a resin or a polymer, but is not limited thereto. The insulating material 400 may include a known insulating material as long as it is applicable in an inkjet filling scheme.

Figure 9:
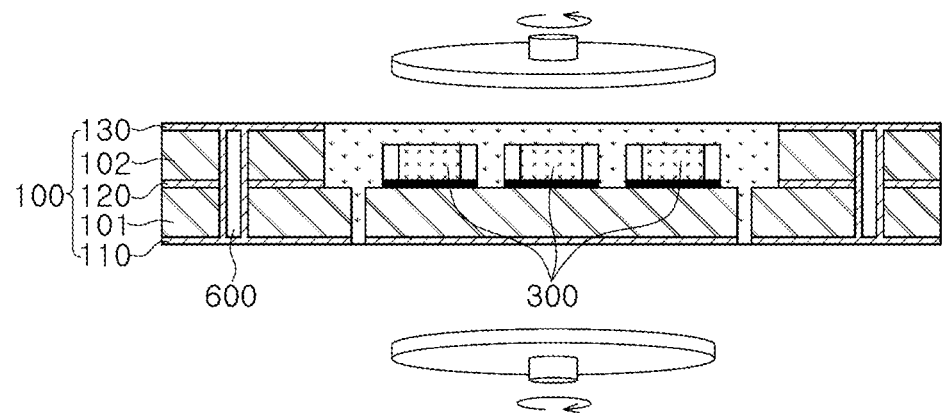

FIG. 9 is a view illustrating that the insulating material 400 flowing out of the cavity C of the core portion 100 and the first and second penetration holes 210 and 220 is processed. In a case where the insulating material 400 is disposed in the inkjet filling scheme, the insulating material 400 may protrude from the cavity C and each of the first and second penetration holes 210 and 220. In order to planarize these protrusions, a cutting process may be performed. In this case, both surfaces of the core portion 100 may be coplanar with both surfaces of the insulating material 400, respectively, but the core portion 100 and the insulating material 400 are not limited thereto.

Figure 10:
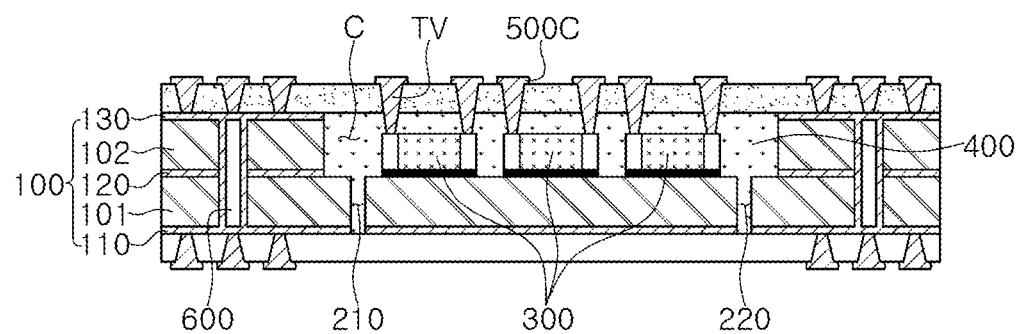

Thereafter, a build-up layer 500 may be formed on each of both surfaces of the planarized core portion 100 as illustrated in FIG. 10. The build-up layer 500 may include at least one circuit layer 500C, at least one insulating layer, and at least one via. In this case, in order to connect the circuit layer 500C of the build-up layer 500 and the electronic component 300 to each other, a through via TV may be formed to penetrate through at least a portion of the insulating material 400 in the cavity C, but is not limited thereto.

Figure 11:
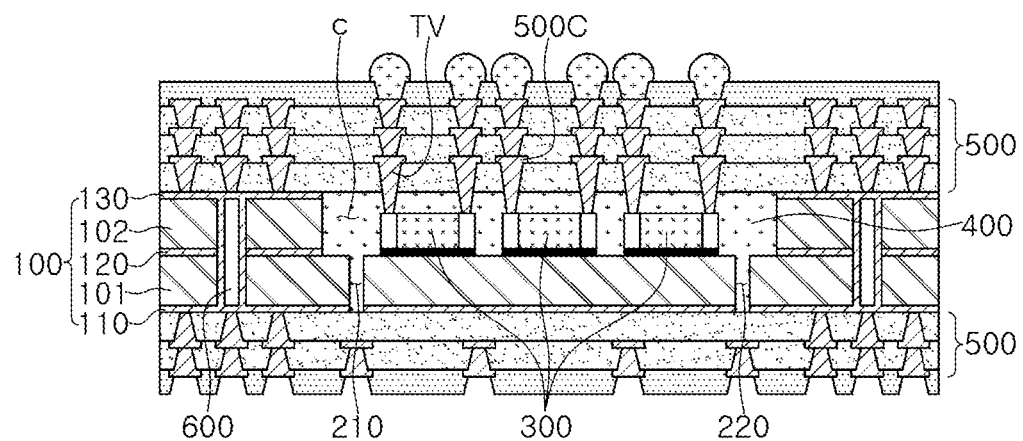

Last, as illustrated in FIG. 11, a solder resist layer and a solder may be formed on an outermost insulating layer and an outermost circuit layer of the build-up layer 500. In this case, the solder resist layer may be formed of a photosensitive material. In addition, the solder resist may have thermosetting and/or photocurable properties, but is not limited thereto.

In particular, a surface treatment layer may be disposed on at least a portion of a circuit layer formed on one surface of the outermost insulating layer, and the surface treatment layer may include a different composition from each of the circuit layers. For example, each of the circuit layers may include copper (Cu), and the surface treatment layer may include nickel (Ni) or tin (Sn), but the circuit layer and the surface treatment layer are not limited thereto.

The printed circuit board 10 according to the present disclosure may include a core portion 100 including a cavity C in one surface thereof, first and second penetration holes 210 and 220 disposed on a bottom surface of the cavity C and penetrating through the core portion 100, an electronic component 300 disposed in the cavity C, and an insulating material 400 filling the cavity C and each of the first and second penetration holes 210 and 220. In particular, in this case, a sidewall of the cavity C may be higher than the electronic component 300. That is, the cavity C, in which the electronic component 300 is disposed, may be formed to be thicker than the electronic component 300, so that the insulating material 400 filling the cavity C covers an upper surface and each of both side surfaces of the electronic component 300.

By configuring the core portion 100 to have the electronic component 300 embedded therein, it is possible to manufacture a printed circuit board with improved P/I characteristics and enhanced warpage characteristics.

Concerning the other components, what has been described above is substantially identically applicable, and thus, the detailed description thereof will not be repeated.

As set forth above, as one effect of the present disclosure, it is possible to provide a printed circuit board including a fine circuit and/or a fine via.

As another effect of the present disclosure, it is possible to provide a printed circuit board with an electronic component mounted in a cavity thereof.

While exemplary embodiments have been shown and described above, it will be apparent to those skilled in the art that modifications and variations could be made without departing from the scope of the present disclosure as defined by the appended claims.

What is claimed is:

1. A printed circuit board comprising:
   a core portion including a cavity and a first insulating layer;
   first and second penetration holes connected to a bottom surface of the cavity and at least partially penetrating through the first insulating layer;
   an electronic component disposed in the cavity; and
   an insulating material filling the cavity and each of the first and second penetration holes,
   wherein a depth of the cavity is larger than a thickness of the electronic component, and
   wherein the core portion further includes first and second metal layers disposed on both surfaces of the first insulating layer respectively, a second insulating layer disposed on one surface of the second metal layer, and a third metal layer disposed on one surface of the second insulating layer.

2. The printed circuit board of claim 1, wherein the insulating material is integrally disposed in the cavity and the first and second penetration holes.

3. The printed circuit board of claim 1, further comprising at least one build-up layer disposed on each of both surfaces of the core portion.

4. The printed circuit board of claim 3, wherein the at least one build-up layer includes a circuit layer,
   the printed circuit board further comprises a through via connecting the circuit layer and the electronic component to each other.

5. The printed circuit board of claim 4, wherein the through via penetrates through at least a portion of the insulating material.

6. The printed circuit board of claim 1, wherein the core portion has a thickness of 1.2 mm or more.

7. The printed circuit board of claim 1, further comprising a through hole penetrating through the core portion.

8. The printed circuit board of claim 1, wherein the first insulating layer is thicker than the first metal layer.

9. A method for manufacturing a printed circuit board, the method comprising:
   preparing a core portion, including a first insulating layer, in which a through hole is formed;
   forming a cavity in one surface of the core portion;
   forming a plurality of penetration holes at least partially penetrating through the first insulating layer on a bottom surface of the cavity;
   disposing an electronic component on the bottom surface of the cavity; and
   filling the cavity and each of the plurality of penetration holes with an insulating material,
   wherein a sidewall of the cavity is higher than the electronic component, and
   wherein the core portion further includes first and second metal layers disposed on both surfaces of the first insulating layer respectively, a second insulating layer disposed on one surface of the second metal layer, and a third metal layer disposed on one surface of the second insulating layer.

10. The method of claim 9, wherein at least a portion of the insulating material protrudes from the core portion.

11. The method of claim 10, further comprising:
    processing the insulating material protruding from the core portion; and
    disposing a build-up layer on each of both surfaces of the core portion.

12. The method of claim 11, wherein the processing of the insulating material protruding from the core portion includes processing the insulating material such that both surfaces of the core portion are coplanar with both surfaces of the insulating material, respectively.

13. The method of claim 9, wherein the filling of the cavity and each of the plurality of penetration holes with the insulating material uses an inkjet filling scheme.

14. The method of claim 9, wherein the first insulating layer is thicker than the first metal layer.

15. A printed circuit board comprising:
    a core portion including a cavity;

at least one penetration hole connected to a bottom surface of the cavity and at least partially penetrating through the core portion;

an electronic component disposed in the cavity; and an insulating material filling the cavity and the at least one penetration hole, wherein a depth of the cavity is larger than a thickness of the electronic component, wherein a central axis of the at least one penetration hole is offset from the electronic component and a center of the cavity, wherein at least one build-up layer is disposed on each of both surfaces of the core portion, wherein the at least one build-up layer includes a circuit layer, and wherein a through via connects the circuit layer and the electronic component to each other.

16. The printed circuit board of claim 15, wherein the central axis of the at least one penetration hole is nearer to a sidewall of the cavity than to the center of the cavity.

17. The printed circuit board of claim 15, wherein the insulating material is integrally disposed in the cavity and the at least one penetration hole.

18. The printed circuit board of claim 15, wherein the core portion has a thickness of 1.2 mm or more.

19. The printed circuit board of claim 15, wherein the core portion further includes a first insulating layer through which the at least one penetration hole penetrates, first and second metal layers disposed on both surfaces of the first insulating layer respectively, a second insulating layer disposed on one surface of the second metal layer, and a third metal layer disposed on one surface of the second insulating layer.

20. The printed circuit board of claim 19, wherein the first insulating layer is thicker than the first metal layer.

* * * * *